(12) United States Patent
Harada et al.

(10) Patent No.: US 7,935,628 B2
(45) Date of Patent: May 3, 2011

(54) SILICON CARBIDE SEMICONDUCTOR DEVICE AND METHOD FOR PRODUCING THE SAME

(75) Inventors: Shinsuke Harada, Ibaraki (JP); Makoto Katou, Ibaraki (JP); Kenji Fukuda, Ibaraki (JP); Tsutomu Yatsuo, Ibaraki (JP)

(73) Assignee: National Institute for Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/310,024

(22) PCT Filed: Aug. 1, 2007

(86) PCT No.: PCT/JP2007/065077
§ 371 (c)(1),
(2), (4) Date: Jun. 30, 2009

(87) PCT Pub. No.: WO2008/018342
PCT Pub. Date: Feb. 14, 2008

(65) Prior Publication Data
US 2009/0321746 A1 Dec. 31, 2009

(30) Foreign Application Priority Data
Aug. 9, 2006 (JP) ................... 2006-216428

(51) Int. Cl.
*H01L 21/28* (2006.01)
(52) U.S. Cl. ... 438/656; 438/931; 257/77; 257/E21.062; 257/E29.104
(58) Field of Classification Search ............ 257/77, 257/E29.104, E29.118, E21.158, E21.054, 257/E21.055, E21.062, E21.065; 438/654, 656, 931
See application file for complete search history.

(56) References Cited

U.S. PATENT DOCUMENTS

| | | | |
|---|---|---|---|
| 6,815,299 B2* | 11/2004 | Kiritani | 438/305 |
| 2003/0067033 A1 | 4/2003 | Kinoshita et al. | |
| 2004/0211355 A1* | 10/2004 | Motoki et al. | 117/19 |
| 2004/0211980 A1* | 10/2004 | Ryu | 257/200 |
| 2005/0045892 A1 | 3/2005 | Hayashi et al. | |
| 2005/0245034 A1* | 11/2005 | Fukuda et al. | 438/285 |
| 2008/0017984 A1* | 1/2008 | Farooq et al. | 257/738 |

FOREIGN PATENT DOCUMENTS

JP 2000-208438 7/2000
(Continued)

OTHER PUBLICATIONS

International Search Report mailed Oct. 30, 2007 for International Application No. PCT/JP2007/065077.
(Continued)

*Primary Examiner* — Benjamin P Sandvik
*Assistant Examiner* — W. Wendy Kuo
(74) *Attorney, Agent, or Firm* — Wenderoth, Lind & Ponack, L.L.P.

(57) ABSTRACT

A low on-resistance silicon carbide semiconductor device is provided to include an ohmic electrode of low contact resistance and high adhesion strength formed on a lower surface of silicon carbide. Specifically, the silicon carbide semiconductor device includes at least an insulating film, formed on an upper surface of a silicon carbide substrate, and includes at least an ohmic electrode, formed of an alloy comprising nickel and titanium, or formed of a silicide comprising nickel and titanium, and which is formed on the lower surface of the silicon carbide substrate.

1 Claim, 2 Drawing Sheets

FOREIGN PATENT DOCUMENTS

| | | |
|---|---|---|
| JP | 2002-270839 | 9/2002 |
| JP | 2003-101039 | 4/2003 |
| JP | 2005-51096 | 2/2005 |
| JP | 2006-32457 | 2/2006 |
| JP | 2006-60451 | 3/2006 |
| WO | 2004/003989 | 1/2004 |

OTHER PUBLICATIONS

L.G. Fursin, J.H. Zhao, M. Weiner, "Nickel Ohmic Contacts to P- and N-type 4H-SiC", Electronics Letters, Aug. 16, 2001, vol. 37, No. 17, pp. 1092-1093.

Abstract for Japanese Publication No. 2006-032457 published in Feb. 2006, previously submitted in an IDS filed Feb. 6, 2009.

Kenji Fukuda, et al., "Effect of Gate Oxidation Method on Electrical Properties of Metal-Oxide-Semiconductor Field-Effect Transistors Fabricated on 4H-SiC C(0001) Face", Applied Physics Letters, vol. 84, No. 12, Mar. 22, 2004, pp. 2088-2090.

Junji Senzaki, et al., "Excellent Effects of Hydrogen Postoxidation Annealing on Inversion Channel Mobility of 4H-SiC Mosfet Fabricated on (11 2 0) Face", Electron Device Letters, vol. 23, No. 1, Jan. 2002, pp. 13-15.

* cited by examiner

SILICON CARBIDE SEMICONDUCTOR DEVICE AND METHOD FOR PRODUCING THE SAME

BACKGROUND OF THE INVENTION

1. Field of Invention

The present invention relates to a silicon carbide semiconductor device, and a method for producing the same. Particularly, the invention relates to a silicon carbide semiconductor device characterized by an ohmic electrode formed on a lower surface of silicon carbide, and a method for producing the same.

2. Description of the Related Art

Silicon carbide (SiC) is superior to silicon (Si) in terms of properties including a wider band gap and a higher breakdown strength. Thus, use of silicon carbide (SiC) as a substrate material enables fabrication of a high-voltage and low-resistance power semiconductor device, beyond the limits of silicon (Si).

Another property of silicon carbide (SiC) is that it allows for formation of an insulating film by thermal oxidation, as does silicon (Si). For these reasons, use of silicon carbide (SiC) as a substrate material is considered to provide a high-voltage and low on-resistance MOSFET. Many studies and developments are underway regarding the use of silicon carbide (SiC) as a substrate material.

To this time, the developments of MOSFET have been conducted on the (0001) plane, because of the availability of the relatively inexpensive and highly crystalline epitaxial wafers. However, because the channel mobility at the MOS interface is low on this surface, it has been difficult to realize low on-resistance. Furthermore, there have been reports that an atmosphere of thermal oxidation has a large influence on the MOS interface channel mobility in the (000-1) and (11-20) planes, situated beneath and beside the (0001) plane, respectively, and that that mobility in these (000-1) and (11-20) planes can be increased more than in the (0001) plane, when oxidation is performed in a wet atmosphere, as disclosed in Non-Patent Documents 1 and 2 (see below). Thus, using these (000-1) and (11-20) planes is expected to realize a low on-resistance MOSFET.

In a producing method of MOSFET on the (000-1) plane, as described in Patent Document 1, an insulating film is formed by wet oxidation, and the interface state between the insulating film and silicon carbide is terminated with hydrogen. This is followed by vapor deposition of, for example, nickel, in a contact hole formed on an upper surface, and a subsequent heat treatment in hydrogen-containing gas. A result is a production of an ohmic electrode that has both high channel mobility and low contact resistance. In this procedure, it is a common practice to simultaneously perform the heat treatment for the surface electrode, and the ohmic electrode is formed on the lower surface.

The ohmic electrode formed on the lower surface requires not only low contact resistance but high adhesion strength for soldering. In one technique to achieve both low contact resistance and high adhesion strength, the electrode material is prepared from an alloy of nickel and metals of Group IVa, Va, and VIa, such as, for example, titanium, as described in Patent Document 2. In this way, a carbon layer that deposits on the silicide surface during the heat treatment of the alloy forms a carbide with the Group IVa, Va, and VIa metals such as titanium, so as to suppress the deterioration of the adhesion strength due to the carbon layer.

Patent Document 1: Japanese Patent Application 2006-060451.

Patent Document 2: JP-A-2000-208438.
Non-Patent Document 1: Fukuda et al. Applied Physics Letters, Vol. 84, pp. 2088-2090.
Non-Patent Document 2: Senzaki et al. Electron Device Letters, Vol. 23, pp. 13-15.

BRIEF SUMMARY OF THE INVENTION

However, as described above, the ohmic electrodes on the upper and lower surfaces of the silicon carbide are generally formed by the same heat treatment. Thus, in the production of a vertical MOSFET in which the upper surface is the (000-1) plane or the (11-20) plane, the heat treatment that forms the ohmic electrode on the lower surface is performed in an atmosphere that contains hydrogen. The hydrogen in the atmosphere of the heat treatment embrittles the surface of the ohmic electrodes formed on the lower surface, lowering the adhesion strength for soldering.

The present invention was made in view of the foregoing problems, and an object of the invention is to provide a low on-resistance silicon carbide semiconductor device including an ohmic electrode of low contact resistance and high adhesion strength formed on the lower surface of silicon carbide. The invention also provides a method for producing such a semiconductor device.

In order to solve the foregoing problems, the present invention provides the following aspects.

A first aspect is directed to a silicon carbide semiconductor device including: at least an insulating film, formed on an upper surface of silicon carbide; and at least an ohmic electrode, formed of an alloy comprising nickel and titanium, or formed of a silicide comprising nickel and titanium, the ohmic electrode being formed on a lower surface of the silicon carbide.

A second aspect is directed to a silicon carbide semiconductor device according to the first aspect, in which the ratio of the titanium to the nickel is more than 17%.

A third aspect is directed to a silicon carbide semiconductor device according to the first or second aspects, in which the lower surface of the silicon carbide is a (0001) plane.

A fourth aspect is directed to a silicon carbide semiconductor device according to the first or second aspects, in which the lower surface of the silicon carbide is a (−1120) plane.

A fifth aspect is directed to a silicon carbide semiconductor device according to any one of the first to fourth aspects, in which the silicon carbide contains hydrogen.

A sixth aspect is directed to a method for producing a silicon carbide semiconductor device, the method including: forming at least an insulating film on an upper surface of silicon carbide; and forming at least an ohmic electrode, formed of an alloy comprising nickel and titanium, or formed of a silicide comprising nickel and titanium, on a lower surface of the silicon carbide, by a heat treatment in a hydrogen-containing atmosphere.

The present invention suppresses the surface embrittlement of an ohmic electrode formed on the lower surface of silicon carbide even when the ohmic electrode is subjected to a heat treatment in an atmosphere that contains hydrogen. The invention therefore provides a lower electrode having high adhesion strength and low resistance.

DESCRIPTION OF REFERENCE NUMERALS

Figure 1:
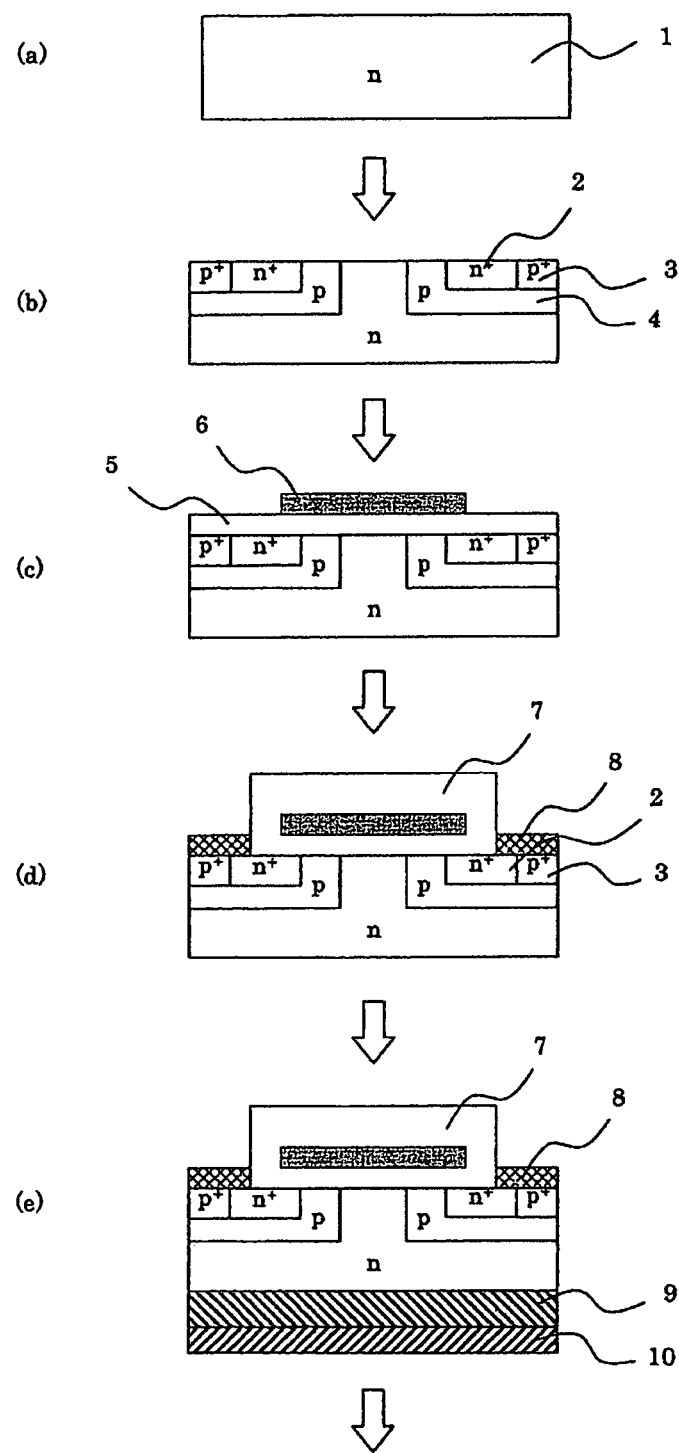
FIG. 1 is a diagram showing fabrication steps of a vertical MOSFET having an electrode configuration according to the present invention.

1: 4H-SiC n-type (000-1) substrate
2: High-density n-type source
3: High-density p-type region
4: p well
5: Gate insulating film
6: Polysilicon gate electrode
7: Interlayer insulating film
8: Nickel-aluminum metal layer
9: Nickel
10: Titanium
11: Source ohmic electrode
12: Drain ohmic electrode
13: Source metal
14: Drain metal

DETAILED DESCRIPTION OF THE INVENTION

An embodiment of the present invention is described below with reference to FIG. 1 through FIG. 3.

Figure 2:
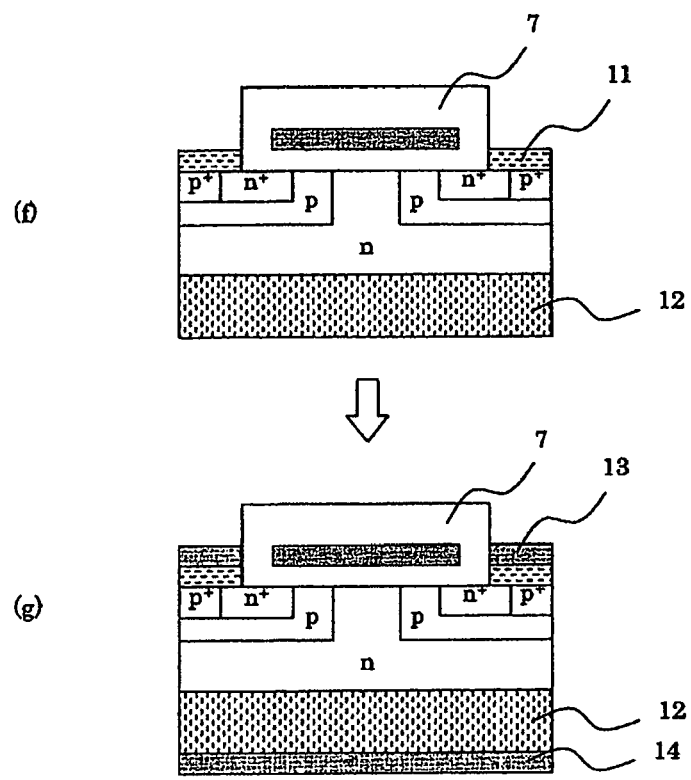
FIG. 2 is a diagram showing fabrication steps of a vertical MOSFET having an electrode configuration according to the present invention.

FIG. 1 and FIG. 2 are diagrams illustrating the fabrication steps of a vertical MOSFET having an electrode configuration according to the present invention.

As shown in FIG. 1(a), a 4H-SiC n-type (000-1) substrate 1 is prepared. Then, as shown in FIG. 1(b), an upper, (000-1) surface is subjected to ion implantation through a mask, and activation annealing is performed to selectively form a high-density n-type source 2, a high-density p-type region 3, and a p well 4. Next, as shown in FIG. 1(c), a gate insulating film 5 is formed over the surface by wet thermal oxidation at 950° C., and a polysilicon gate electrode 6 is formed thereon. Then, as shown in FIG. 1(d), an interlayer insulating film 7 is deposited thereon, and a contact hole is formed in contact with both the high-density n-type source 2 and the high-density p-type region 3. Inside the contact hole, a metal layer 8 of nickel and aluminum is formed. Then, as shown in FIG. 1(e), nickel 9 and titanium 10 are vapor deposited on a lower, (0001) surface. Here, the nickel 9 is formed in a thickness of 60 nm. The thickness of the titanium 10 is varied between 2 and 20 nm for each sample. Next, as shown in FIG. 2(f), the substrate is annealed in 4% hydrogen-containing helium gas at 900° C. for 2 minutes with raising and lowering temperature for 1 minute. As a result, a source ohmic electrode 11 and a drain ohmic electrode 12 are formed, each being an alloy layer of the deposited metal and silicon carbide. As a result, hydrogen is taken into the silicon carbide. Thereafter, as shown in FIG. 2(g), a source metal 13 and a drain metal 14 are formed on the source ohmic electrode 11 and the drain ohmic electrode 12, respectively. The source metal 13 is formed from titanium (50 nm) and aluminum (2 μm). The drain metal 14 is formed by depositing titanium, nickel, silver, and gold in this order, in thicknesses of 50 nm, 100 nm, 100 nm, and 100 nm, respectively.

The adhesion between the drain ohmic electrode 12 and the drain metal 14 is evaluated by attaching the sample to an adhesive tape, and by checking for any remaining metal layer on the tape after detaching the tape.

Figure 3:
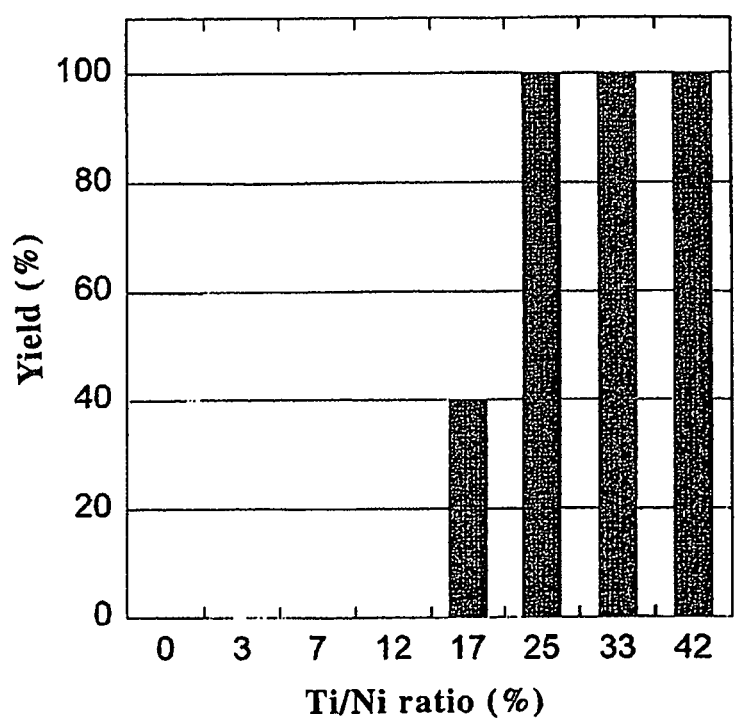
FIG. 3 is a diagram representing the result of an adhesion test of a drain ohmic electrode with a drain metal, obtained by varying the proportion of titanium with respect to the nickel contained in the drain ohmic electrode.

FIG. 3 shows the result of the adhesion test of the drain ohmic electrode 12 and the drain metal 14, obtained by varying the proportion of titanium with respect to the nickel contained in the drain ohmic electrode 12.

As shown in FIG. 3, the metal layer is detached in all samples when the titanium/nickel ratio is 0% to 12%. The percent of attachment increases as the proportion of titanium is increased. The metal layer remains attached in all samples when the ratio is more than 17%, or in terms of the thickness in the foregoing example, when the titanium is 10 nm or greater with respect to the thickness, 60 nm, of the nickel 9.

The present invention, described above through an embodiment of forming the ohmic electrode on the lower, (0001) plane of the 4H-SiC n-type (000-1) substrate, is equally effective for the lower, (-1-120) plane of an (11-20) substrate. Further, the invention is equally effective and applicable to the (11-20), (1-210), (-12-10), (-2110), and (2-1-10) planes, because these planes are equivalent to the (-1-120) plane in terms of crystalline structure.

The invention claimed is:
1. A method for producing a vertical silicon carbide semiconductor device, the method comprising:
  forming at least an insulating film on an upper (000-1) or (11-20) surface of a 4H n-type silicon carbide semiconductor substrate by wet thermal oxidation; and
  forming at least an ohmic electrode of one of (i) an alloy comprising nickel and titanium and (ii) a silicide comprising nickel and titanium, such that a ratio of the titanium to the nickel of the ohmic electrode is more than 17%, the ohmic electrode being formed on a lower surface of the 4H n-type silicon carbide semiconductor substrate by a heat treatment in a hydrogen-containing rare gas atmosphere.

* * * * *